United States Patent
Liebeke et al.

(10) Patent No.: US 6,905,013 B2
(45) Date of Patent: Jun. 14, 2005

(54) COMPONENT TAPE TRANSPORT WHEEL AND TRANSPORT SYSTEM, AND METHOD OF OPERATING A COMPONENT TAPE TRANSPORT SYSTEM

(75) Inventors: Thomas Liebeke, Ottobrunn (DE); Herbert Wallner, Schoenaich (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 10/348,900

(22) Filed: Jan. 23, 2003

(65) Prior Publication Data

US 2003/0226873 A1 Dec. 11, 2003

(30) Foreign Application Priority Data

Jun. 5, 2002 (DE) ......................................... 102 24 998

(51) Int. Cl.[7] ........................ B65G 23/00; B65G 23/28; B65G 23/44
(52) U.S. Cl. ..................................... 198/832; 198/832.1
(58) Field of Search .............................. 198/832, 832.1, 198/834; 360/96.3; 242/344

(56) References Cited

U.S. PATENT DOCUMENTS

| | | | | |
|---|---|---|---|---|
| 4,476,504 A | * | 10/1984 | Georges | ...................... 360/93 |
| 4,899,048 A | * | 2/1990 | Shelander | .............. 250/231.14 |
| 5,323,286 A | * | 6/1994 | Faul | ........................... 360/137 |
| 5,608,584 A | * | 3/1997 | Steinberg et al. | ............. 360/69 |
| 6,032,845 A | | 3/2000 | Piccone et al. | |
| 6,386,772 B1 | * | 5/2002 | Klinefelter et al. | ......... 400/208 |
| 6,446,791 B1 | * | 9/2002 | Goller et al. | ............ 198/832.1 |
| 6,591,483 B1 | * | 7/2003 | Kay | ............................. 29/607 |
| 2004/0031665 A1 | | 2/2004 | Baumeister et al. | |

FOREIGN PATENT DOCUMENTS

EP 0967 851 A1 12/1999

* cited by examiner

Primary Examiner—Gene O. Crawford
(74) Attorney, Agent, or Firm—Harness, Dickey & Pierce, P.L.C.

(57) ABSTRACT

A component tape transport wheel, a component tape transport system and a method of operating a component tape transport system are provided, in which there is a rigid coupling between a transport wheel and an encoder wheel which is arranged on the transport wheel and whose position relative to a sensor can be determined. By this rigid coupling between the transport wheel which moves the component tape and a registration system including an encoder wheel and sensor for registering the position of the transport wheel, it is possible to register the position of the transport wheel at any time with the greatest accuracy. Even after a component tape transport system has been switched off, a determination of the absolute position of the transport wheel is possible, since the distance between two encoder elements of the encoder wheel is less than any play possibly caused by a drive of at least one of the transport wheel and an associated gear mechanism.

18 Claims, 2 Drawing Sheets

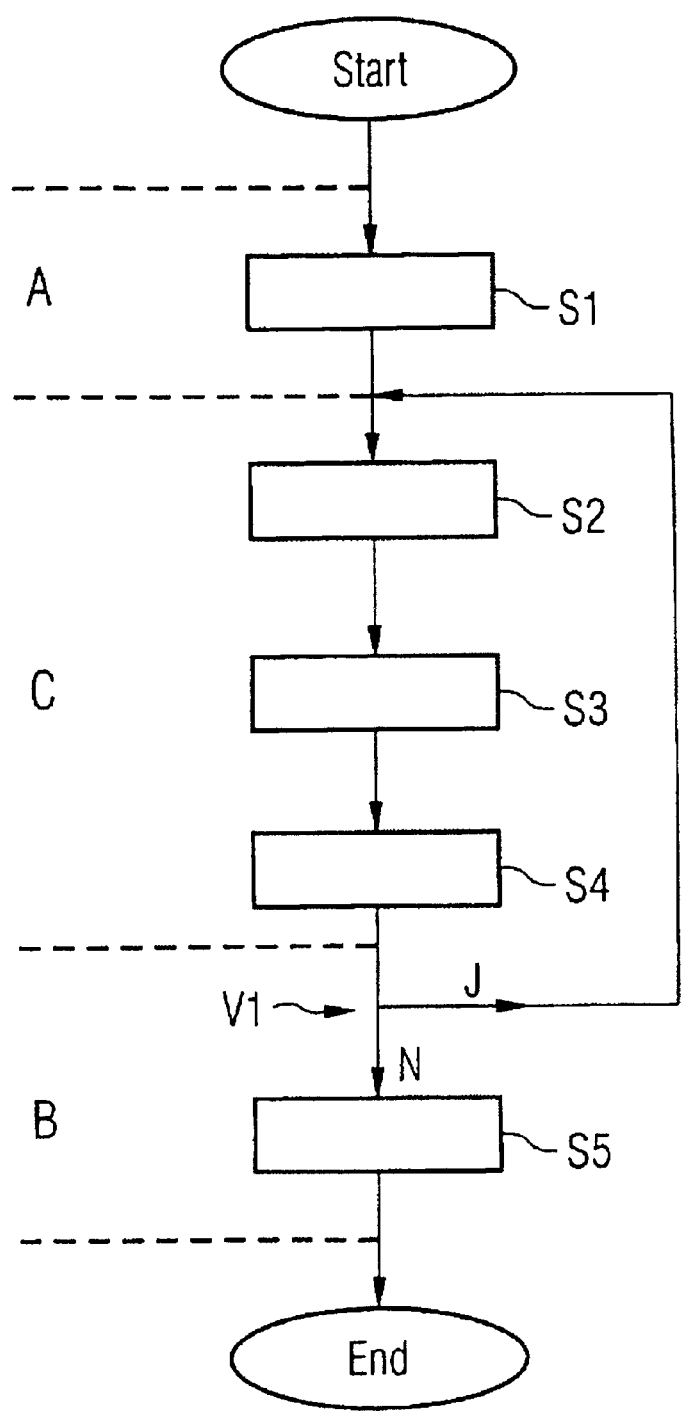

COMPONENT TAPE TRANSPORT WHEEL AND TRANSPORT SYSTEM, AND METHOD OF OPERATING A COMPONENT TAPE TRANSPORT SYSTEM

The present application hereby claims priority under 35 U.S.C. §119 on German patent application number DE 10224998.9 filed Jun. 5, 2002, the entire contents of which are hereby incorporated herein by reference.

FIELD OF THE INVENTION

The invention generally relates to a component tape transport wheel, a component tape transport system and a method of operating a component tape transport system. Preferably, the component tape transport wheel has a disk-like internal body from which a multiplicity of transport pins in each case extend radially which, during the transport of component tapes, can engage in their transport openings.

BACKGROUND OF THE INVENTION

Component tapes nowadays represent the most important form of packaging components. The tapes of the components are suitable both for fabrication in high numbers and also for small batch sizes, which make frequent changeover necessary. The component tapes are provided via feed modules to a fitting apparatus for fitting SMD components, for example. In this case, the feed modules have the task of ensuring trouble-free provision of the components from the tape. Here, the component tape runs from a roll into the feed module, the covering tape being pulled off the tape, so that the components can be removed by a fitting head, for example upward, at a collecting position.

The component tapes conventionally have fixed tape step widths. Thus, in each case, a component is fitted to the component tape at predetermined intervals of, for example, 1 mm, 2 mm, 4 mm, 8 mm and so on, for example inserted into a pocket in the component tape and secured by the covering tape against falling out.

In order to ensure rapid feeding, conventional feed modules have transported the component tapes onward successively at high speed by one of the fixed tape step widths in each case, pulling off the covering film, in order to provide the next component at the collecting position. For this purpose, for example, mechanical sequential drives have been used, which have transported the pin wheel onward in each case by one tape step width, as described in EP 967851, for example.

However, feed modules for fixed, mechanically predetermined tape step widths have the disadvantage that, firstly, only tapes with a single step width can be used and, secondly, correction of the collecting position is not possible, since the tape is always transported onward by a predetermined length. In particular in the case of very small components, however, there is the demand to be able to change the collecting position in order to be able to compensate for positional deviations of the component in the tape pocket. Furthermore, for a wider variety of possible uses of the feed modules, it is necessary to be able to process tapes with different tape step widths with a single tape feed module.

SUMMARY OF THE INVENTION

There is therefore an object of specifying a component tape transport wheel, a component tape transport system and a method of operating a component tape transport system in which correction of the collecting position and the use of component tapes with a different tape step width are possible.

According to embodiments of the invention, this object may be achieved by a component tape transport wheel, a component tape transport system and/or a method of operating a component tape transport system.

As compared with the prior art, the component tape transport wheel according to an embodiment of the invention has many advantages. For example, an encoder wheel is fitted in one piece to the transport wheel and is used for determining the position of the transport wheel. The encoder wheel is equipped, for example with permanent magnets, in such a way that an unambiguous association between the position of the encoder wheel and the transport wheel, respectively, and a sensor that registers the encoder wheel is provided. Therefore, even after a stoppage of the component tape transport wheel which, for example, can be used in a feed module for components, the actual position of the component tape transport wheel can be determined at any time. This position information can be used, for example, to determine exactly the collecting position of a component to be fitted.

For example, the encoder wheel is suitable, together with the sensor, to form an incremental displacement sensor. The latter can have permanent magnets whose poles extend in the radial direction of the component tape transport wheel and, circumferentially, are formed with alternating polarity on the encoder wheel. This makes it possible, via the sensor, to register both sine and cosine signals from the position of the encoder wheel relative to the sensor and, from this, to determine the absolute position of the transport wheel relative to the sensor.

It is possible to form the encoder wheel as a thin magnetizable layer or to use a magnetizable material which, for example, can be an injection molding material, from which the poles of the encoder wheel are then formed in the manner of teeth. However, it is also possible to provide encodings other than magnetic encodings on the encoder wheel, for example conductive, optical etc.

The transport wheel can have a marking by which its zero position can be determined. This marking can be formed, for example, as an optical marking, conductive marking and/or magnetic marking and can be arranged at any desired point on the transport wheel. When the marking passes through a sensor, which can also be the sensor which registers the encoder wheel, it is possible to generate a signal which indicates that the transport wheel is located at its zero position or at its initial position.

As a result of the mechanical firm coupling according to an embodiment of the invention between the encoder wheel and transport wheel, any desired positioning of component tapes is possible without limiting fixed tape step widths. Since the position of the component tape is registered directly on the output of the component tape drive, high accuracies are possible. It is possible for any desired tape step widths to be set. Any inaccuracies arising from gear errors such as play or nonlinearity, which would make the positioning accuracy poorer, are ruled out. In order to achieve still higher positioning accuracy, the transport pins can be provided with a plastic coating. This leads to lower deformations of the transport openings of the component tape and, as a result, to improved accuracy.

In the component tape transport system according to an embodiment of the invention, in addition to a component tape transport wheel according to an embodiment of the invention, provision is also made for a guide element, by which the component tape is guided relative to the transport wheel, a sensor for registering the relative position of the encoder wheel relative to the sensor, and a drive for moving the component tape transport wheel around its axis of rotation. In this case, the angular resolution of the sensor interacting with the encoder wheel is selected to be finer than any angular play of the transport wheel possibly caused by the drive and/or a gear mechanism present on the drive. The gear mechanism is, for example, a worm drive, the worm gear being fitted to the transport wheel. In the sense of the invention, finer resolutions is understood to mean a higher resolution, so that the resolution of the system comprising encoder wheel and sensor is greater than a possible angular error of the drive, in order to make it possible to determine the absolute position unambiguously even within this angular error.

Since the angular resolution of the sensor interacting with the encoder wheel is finer than angular play of the drive which may possibly occur, it is possible, even after the component tape transport system has been switched off, to determine the absolute position of the transport wheel at any time, since the absolute position of the transport wheel between two encoder elements can be determined from, for example, sine and cosine signals from the sensor.

In particular, this property of the component tape transport wheel according to an embodiment of the invention can be used in conjunction with a self-locking gear mechanism. For example, a worm drive can be used as a self-locking gear mechanism. The latter is self-locking if it is not supplied with drive power. The result of this is that, while the component tape transport system is switched off, the position of the transport wheel can change only within the range of movement predefined by the gear mechanism play. If, then, the angular resolution of the sensor is selected such that a large number of angular increments can be resolved within an angular difference corresponding to the gear mechanism play, it is possible to determine the position of the transport wheel unambiguously even after switch-off. The distance between two encoder elements, for example the magnetic poles, is also referred to as an encoder period. According to an embodiment of the invention, this encoder period corresponds to the gear mechanism play or is less than the latter. Since sine and cosine signals can be output as the output signal from the sensor, the position of the encoder relative to the sensor can be interpolated, for example via the inverse tangent function. A very high resolution within one encoder period can therefore be realized. For example, within a gear mechanism play of 0.6 mm, as one encoder period, 256 angular increments can be interpolated. The resolution is therefore 0.6 mm:256. By this, even after switch-off, unambiguous positioning of the transport wheel is possible if, during switch-off, the position difference experienced by the transport wheel is less than ± one half encoder period, for example less than ±0.3 mm on the encoder wheel in the above example.

In addition, a control device can be provided with which, together with the drive and the sensor, a closed control loop is formed. In this way, exact maintenance at any time of predefined tape step widths or positions for collecting positions of component tapes is ensured.

In order to permit still better assignment of positions of the transport wheel even after the component tape transport system has been switched off, the control device can have a data memory in which data about the geometric association between the transport pins of the transport wheel and the encoder wheel is stored. In this case, for each encoder element, for example a magnetic pole, in relation to each or at least some transport pins, the exact geometric association is defined in the form of Cartesian or polar coordinates, for example. These values can be used to set to zero any deviations occurring during the production of the component tape transport wheel and/or the component tape transport system for the operation of the component tape transport system, so that an extremely high accuracy is obtained both when maintaining the desired tape step width and the desired collecting position of the components.

In order to determine the absolute position of the transport wheel in a component tape transport system, firstly the fraction of an angular distance between two adjacent encoder elements is determined from the positions of encoder elements with respect to the registering sensor. For example, the sensor can supply sine and cosine signals, from which, even within the distance between two adjacent encoder elements, such as magnetic poles, the absolute position can be determined, for example by forming the inverse tangent. Furthermore, it is necessary to register a numerical value which specifies an integer number of angular distances in each case between two adjacent encoder elements. By linking these two items of information, determination of the absolute position of the transport wheel is possible at any time. Even after switch-off, the absolute position can be calculated exactly if the integer value of the number of angular distances has previously been stored. For example, using the residual energy present in the component tape transport system, this integer value can be written into a nonvolatile memory, such as an EEPROM.

Furthermore, irregularities in the geometric associations between the respective transport pins of the transport wheel and the respective adjacent encoder elements can be registered, in order to be able to correct these irregularities to zero during operation. The irregularities determined can be stored, for example, in a nonvolatile memory. It is sufficient to determine the irregularities once, before the commissioning of a component tape transport system, and to store these permanently in a control device belonging to the same or in a control computer connected to said system.

BRIEF DESCRIPTION OF THE DRAWINGS

The invention will be explained in more detail with reference to the drawings, in which:

FIG. 2 shows a schematic flowchart of the method according to an embodiment of the invention of operating a component tape transport system.

DETAILED DESCRIPTION OF THE PREFERRED EMBODIMENTS

Figure 1:
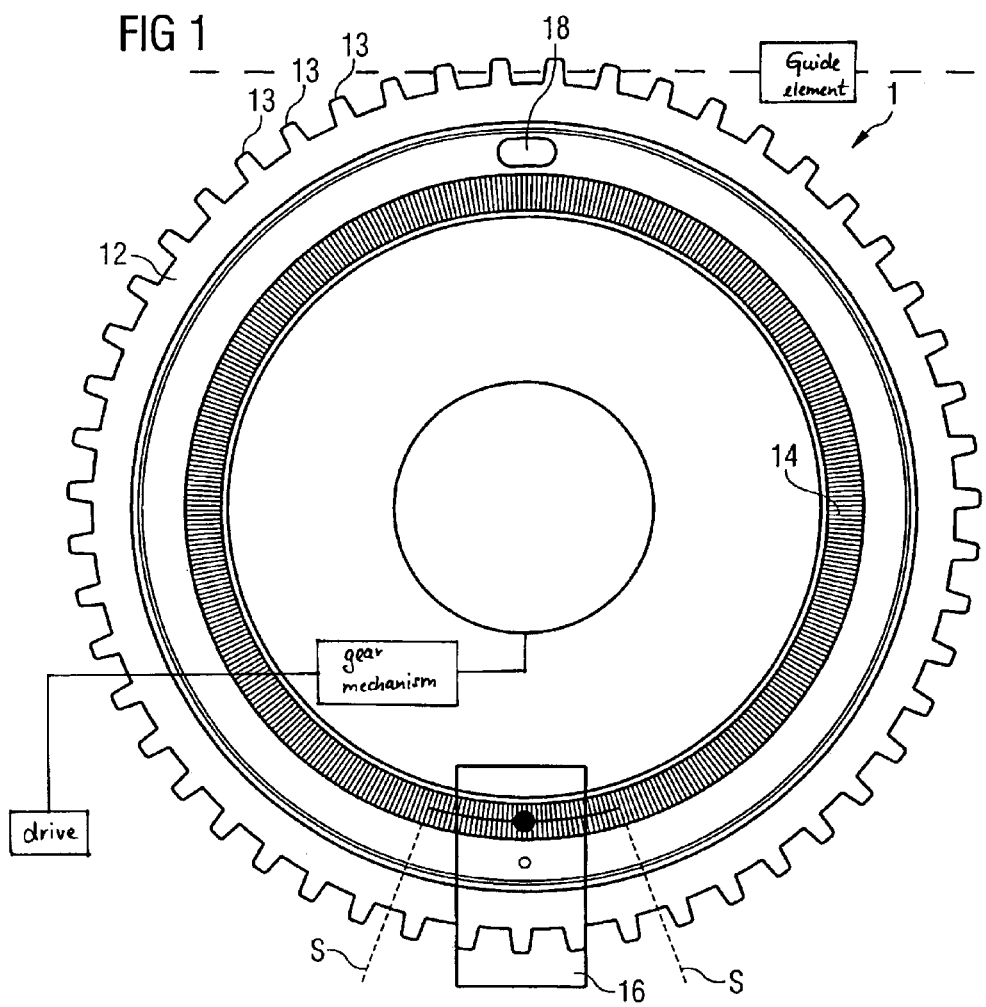
FIG. 1 shows a plan view of a preferred embodiment of the component tape transport wheel according to an embodiment of the invention.

FIG. 1 reveals a schematic plan view of a component tape transport wheel according to an embodiment of the invention. The transport wheel 1 has a substantially disk-like body 12 which is provided with a multiplicity of transport pins 13, which are arranged to extend radially in each case. The transport pins 13 are suitable to engage in the transport openings of component tapes during the transport of the latter in order to permit translation of the component tapes, which is brought about by rotation of the transport wheel.

Fitted to the disk-like body 12, for example in an annular depression, is an encoder wheel 14. The encoder wheel 14 is firmly coupled to the body 12, so that an unambiguous assignment of the transport pins 13 to the encoder elements of the encoder wheel 14 is possible. If the component tape transport wheel 1 according to an embodiment of the invention is guided past a sensor 16 which can register the encoder elements of the encoder wheel 14, then in interaction with the sensor 16, the position of the encoder wheel 14 and therefore the position of the transport wheel 1 can be determined unambiguously in relation to a stationary reference point, such as the position of the sensor 16.

A marking 18 can, for example, be formed in the body 12. A marking 18 formed as an opening can be seen from FIG. 1. If this is guided past a further registering unit of the sensor 16, a signal can be output which indicates that a zero position of the transport wheel 1 has been assumed. Starting from this, by counting the encoder elements of the encoder wheel 14 moved past the sensor 16, it is possible to determine the angular amount by which the transport wheel 18 has been moved.

The transport direction can also be read out by registering the encoder elements of the encoder wheel 14. For example, when a magnetically operating encoder wheel 14 is used, as a result of the configuration of the poles, for example the shape of the pole flanks, the direction of rotation of the transport wheel 1 can be determined from the different flank shape of the signal from the sensor 16.

Figure 1A:
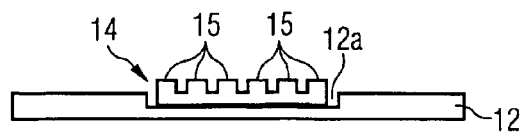
FIG. 1a shows a section through the transport wheel 1 shown in FIG. 1 along the section line S.

FIG. 1a shows a section through the schematic view of the transport wheel 1 along the section line S. As FIG. 1a reveals, the encoder wheel 14 is arranged in a depression 12a in the disk-like body 12. The encoder wheel 14 has a large number of encoder elements 15 which, in FIG. 1a, are shown as substantially tooth-like poles of a magnetizable encoder wheel 14 made of an injection molding material. However, it is also possible to form the encoder wheel 14 as a thin magnetizable layer, in which the encoder elements are formed in the form of magnetized regions.

It is also possible to use optical and/or conductive encoder elements for the encoder wheel 14.

FIG. 2 reveals a schematic flowchart of the method according to the invention of operating a component tape transport system. As FIG. 2 shows, the method according to an embodiment of the invention can in principle be subdivided into three sections A, B and C. In this case, A and B form sections which can be carried out optionally before and after the operation of the component tape transport system. C designates the section of the actual registration of the absolute position of the transport wheel 1 according to the invention, with the steps S2 to S4.

The method according to an embodiment of the invention is therefore started with a start step. The start step is followed in a step S1 by the registration of the zero position of the transport wheel 1. For this purpose, the transport wheel 1 is rotated by a drive until the marking 18 can be registered by the sensor 16. Starting from this position, by counting the encoder elements 15 of the encoder wheel 14 guided past the sensor 16, the angular magnitude of the rotation of the transport wheel 1 relative to the sensor 16 can be registered. However, registering the zero position in step 1 is not absolutely necessary. The signal from the sensor 16 is registered in step 2. The signal registered is evaluated in step S3. This can be done, for example, by the number of encoder elements 15 moved past the sensor 16 being counted or stored in a counting mechanism and/or a region between two successive encoder elements 15 of the encoder wheel 14 being determined by evaluating the sensor signal which, for example, is present as a sine and cosine signal, with the aid of a trigonometric function such as the inverse tangent function.

In a step S4, the angular magnitude determined and the direction of rotation determined are output, for example to a control device for a component tape transport system. If operation is to be continued, this is decided by a yes (J) in a step V1 and a jump is made back before the step S2, where the method according to an embodiment of the invention is repeated in accordance with section C, as can be seen from FIG. 2. In the case of a no (N) in the decision step V1, either the number of encoder elements 15 moved past the sensor 16 is stored in a step S5, or the end of the method according to an embodiment of the invention follows directly.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A component tape transport wheel, comprising:
   a disk-shaped body;
   a plurality of transport pins, extending radially from the disk-shaped body, adapted to engage in transport openings of transported component tapes;
   an encoder wheel, fitted to the body, from which, in interaction with a sensor that registers a position of the encoder wheel, the position of the transport wheel is adapted to be determined unambiguously;
   wherein the transport wheel includes a marking usable to determine a zero position.

2. The component tape transport wheel as claimed in claim 1, wherein the encoder wheel, together with the sensor, form an incremental angle sensor.

3. The component tape transport wheel as claimed in claim 1, wherein the marking is an opening which is formed In the transport wheel and which is arranged in the vicinity of the encoder wheel.

4. The component tape transport wheel as claimed in claim 1, wherein at least the transport pins include a plastic coating.

5. The component tape transport wheel as claimed in claim 1, further comprising a coupling element for driving the transport wheel.

6. The component tape transport wheel as claimed in claim 5, wherein the coupling element is a worm gear.

7. The component tape transport wheel as claimed in claim 1, wherein the encoder wheel includes permanent magnets whose poles extend in the radial direction of the component tape transport wheel and circumferentially are formed with alternating polarity on the encoder wheel.

8. The component tape transport wheel as claimed in claim 7, wherein the encoder wheel includes a thin magnetizable layer in which the poles are formed.

9. The component tape transport wheel as claimed in claim 7, wherein the encoder wheel includes a magnetizable material from which the poles of the encoder wheel are formed in the manner of teeth.

10. The component tape transport wheel as claimed in claim 9, wherein the encoder wheel includes an injection molded material.

11. A component tape transport system, comprising:
    a component tape transport wheel as claimed in claim 1;
    a guide element, by which the component tape is guided relative to the transport wheel;
    a sensor for registering the relative position of the encoder wheel relative to the sensor;

a drive for moving the component tape transport wheel about its axis of rotation;

a gear mechanism connected to the drive for transmitting the drive force to the component tape transport wheel, wherein the angular resolution of the sensor interacting with the encoder wheel is relatively finer than angular play of the transport wheel caused by at least one of the drive and the gear mechanism.

12. The component tape transport system as claimed in claim 11, additionally including a control device from which, together with the drive and the sensor, a closed control loop is formed.

13. The component tape transport system as claimed in claim 12, wherein the control device includes a data memory in which data about the geometric association between the transport pins and the encoder wheel is stored.

14. A method of operating a component tape transport system as claimed in claim 11, wherein the angular position of the transport pins is determined by the steps of:

determining a fraction of the angular distance between two adjacent encoder elements from relative positions of encoder elements in relation to the sensor, and registering a numerical value which is an integer number of angular distances between two adjacent encoder elements.

15. The method as claimed in claim 14, wherein the last integer number of angular distances between two adjacent encoder elements determined before ending the operation of the component tape transport system is stored.

16. The method as claimed in claim 14, wherein geometric associations between the transport pins and respective adjacent encoder elements are registered in advance in order to determine irregularities.

17. The method as claimed in claim 16, wherein the determined irregularities are stored.

18. The method as claimed in claim 17, wherein the determined irregularities are taken into account when determining the angular position of the transport pins.

* * * * *